United States Patent
Ojima et al.

(10) Patent No.: US 7,628,308 B2
(45) Date of Patent: Dec. 8, 2009

(54) METHOD OF REPLENISHING AN OXIDATION SUPPRESSING ELEMENT IN A SOLDER BATH

(75) Inventors: Masayuki Ojima, Tochigi (JP); Haruo Suzuki, Tochigi (JP); Hirofumi Nogami, Ibaraki (JP); Norihisa Eguchi, Takatsuki (JP); Osamu Munekata, Souka (JP); Minoru Ueshima, Matsudo (JP)

(73) Assignees: Senju Metal Industry Co., Ltd., Tokyo (JP); Matushita Electric Industrial Co., Ltd., Kadoma (JP)

( * ) Notice: Subject to any disclaimer, the term of this patent is extended or adjusted under 35 U.S.C. 154(b) by 627 days.

(21) Appl. No.: 10/500,802

(22) PCT Filed: Jan. 8, 2003

(86) PCT No.: PCT/JP03/00050

§ 371 (c)(1),
(2), (4) Date: Jul. 15, 2005

(87) PCT Pub. No.: WO03/059564

PCT Pub. Date: Jul. 24, 2003

(65) Prior Publication Data

US 2006/0011709 A1    Jan. 19, 2006

(30) Foreign Application Priority Data

Jan. 10, 2002    (JP) ............................. 2002-003251

(51) Int. Cl.
| | |
|---|---|
| B23K 20/00 | (2006.01) |
| B23K 31/12 | (2006.01) |
| B23K 13/08 | (2006.01) |
| B23K 15/00 | (2006.01) |
| C21C 1/04 | (2006.01) |
| C22C 13/00 | (2006.01) |
| B23K 31/02 | (2006.01) |

(52) U.S. Cl. ................. 228/102; 228/103; 228/256; 228/260; 228/8; 228/11; 75/386; 420/560

(58) Field of Classification Search ................ 228/102, 228/103, 8, 11, 256–260, 33, 34, 36, 37, 228/40, 39; 75/386; 420/560
See application file for complete search history.

(56) References Cited

U.S. PATENT DOCUMENTS

| | | | | |
|---|---|---|---|---|
| 3,831,263 | A | * | 8/1974 | Dzierski ................. 228/256 |
| 6,474,537 | B1 | * | 11/2002 | Hasegawa et al. ........... 228/260 |
| 6,475,643 | B1 | * | 11/2002 | Hasegawa et al. ........... 428/647 |
| 6,517,602 | B2 | * | 2/2003 | Sato et al. .................... 75/255 |

(Continued)

FOREIGN PATENT DOCUMENTS

EP    0855242    7/1998

(Continued)

*Primary Examiner*—Jessica L. Ward
*Assistant Examiner*—Carlos Gamino
(74) *Attorney, Agent, or Firm*—Michael Tobias

(57) ABSTRACT

The rate of decrease of an oxidation suppressing element in a solder bath is measured during a soldering operation. Soldering is then carried out while replenishing the solder bath is then replenished during soldering so as to maintain the surface level of molten solder in the bath with a replenishment solder alloy which supplies the oxidation suppressing element to the solder bath at at least the rate at which the oxidation suppressing element is consumed during soldering. When the oxidation suppressing element is P, the concentration of P in the replenishment solder alloy is preferably 60-100 ppm.

7 Claims, 1 Drawing Sheet

U.S. PATENT DOCUMENTS

| | | | |
|---|---|---|---|
| 6,699,306 B2 * | 3/2004 | Nishimura et al. | 75/386 |
| 7,148,426 B2 * | 12/2006 | Aoyama et al. | 174/260 |
| 7,282,175 B2 * | 10/2007 | Amagai et al. | 420/562 |
| 7,338,567 B2 * | 3/2008 | Munekata et al. | 148/400 |
| 2005/0005736 A1 * | 1/2005 | Ueshima | 75/690 |

FOREIGN PATENT DOCUMENTS

| | | | |
|---|---|---|---|
| EP | 1273384 | | 1/2003 |
| JP | 55075893 | | 6/1980 |
| JP | 11333589 | | 12/1999 |
| JP | 2000015476 | | 1/2000 |
| JP | 2000288772 | | 10/2000 |
| JP | 2001217531 | | 8/2001 |
| JP | 2002336988 A | * | 11/2002 |
| JP | 2002347688 | | 12/2002 |
| JP | 2004066305 A | * | 3/2004 |
| KR | 2001107354 | * | 12/2001 |
| WO | 0103878 | | 1/2001 |
| WO | WO0162433 | | 8/2001 |

* cited by examiner

333
METHOD OF REPLENISHING AN OXIDATION SUPPRESSING ELEMENT IN A SOLDER BATH

TECHNICAL FIELD

This invention relates to a soldering method and a solder alloy, and particularly to a method of carrying out soldering while controlling the concentration of an oxidation suppressing element in a molten solder bath and to a solder alloy which replenishes solder in the bath.

BACKGROUND ART

A solder alloy is used when mounting electronic parts on a printed circuit board in electronic equipment. Solder alloys having various compositions are used taking into consideration thermal effects on electronic parts and printed circuit boards, workability, and reliability after connection.

A representative example of a soldering method used with these solder alloys is the flow soldering method using a molten solder bath.

The flow soldering method is a method in which after a flux is applied over the entire surface of one side of a printed circuit board on which electronic parts are mounted, preheating is carried out, and one side of the printed circuit board is made to contact a molten solder bath. In recent years, the wave soldering method has become typical as a mounting method for printed circuit boards in mass production where costs are important. This is a method in which molten solder is made to flow from a nozzle to form a stable wave of molten solder, and a printed circuit board is contacted with the top of the wave.

During soldering operations, various soldering defects such as unsoldered portions, bridges, and voids may occur. Particularly with the flow soldering method, since solder is always flowing, the solder which is discharged from the spouting nozzle falls into a stationary area within the bath in the vicinity of the nozzle. Turbulence is produced in the area where the flow of solder falls off, and oxides referred to as dross form due to entrainment of oxygen. If the dross accumulates in the vicinity of the nozzle, the stability of the molten solder wave is disturbed, a portion of the dross which is entrained in the solder wave adheres to the printed circuit board, and this may lead to soldering defects, so it is necessary to periodically remove dross which accumulates on the surface of the solder bath.

A similar problem with the formation of dross can be seen even when using a stationary solder bath when carrying out soldering at a high temperature in an oxidizing atmosphere, such as when carrying out soldering of urethane coated copper wire.

If a large amount of such dross is produced, the time required for dross removal and the amount of discarded solder increase, so running costs increase. Accordingly, it is desirable to decrease the amount of dross from the standpoints of maintenance of a solder bath and cost.

With lead free solder, the material costs are higher, so there is all the greater desire for a decrease in the amount of dross.

In order to reduce dross, as a way of solving the problem by means of the solder alloy, a deoxidizing alloy to which is added an element having an oxidation suppressing effect has been used. A representative example of such an oxidation suppressing element is P. By preferentially reacting with oxygen, P has the effect of suppressing the oxidation of Sn or Pb, which are principal components of a solder alloy.

The oxidation suppressing effect of P is so-called sacrificial oxidation, and as a result it leads to a suppression of dross. P is selectively consumed and its concentration in dross increases, and it is discharged to the exterior of a soldering tank together with dross. Therefore, the amount of P, i.e., of an oxidation suppressing element in the solder alloy decreases, and eventually it is completely consumed.

If an oxidation suppressing element in a solder alloy is entirely consumed, the dross suppressing effect disappears, so the amount of dross which is produced increases, and not only does the amount of discarded solder increase, but soldering defects caused by dross occur, the overall defect rate in flow soldering increases, and running costs may increase.

In this manner, in the prior art, it was known to add P to a solder bath. However, supply of P to a solder bath used a deoxidizing alloy having a much higher concentration of P (such as 0.05-3% P) than the prescribed concentration of P in a solder alloy in a solder bath, so even if a small amount of a deoxidizing alloy was added, a large fluctuation in the P content in the plating bath at the time of replenishing was unavoidable (see Japanese Published Unexamined Patent Application Sho 54-84817).

In addition, there are also examples of solder alloys containing at most 50 ppm of P (see Japanese Published Unexamined Patent Application Sho 55-75893) or containing 0.1-1% of P (see Japanese Published Unexamined Patent Application Hei 11-333589), but these were not used for replenishing a solder bath.

With regards to the oxidation suppressing element P, in the past, the P concentration was focused on, and when the P concentration of the solder in the solder bath decreased, the P concentration of solder in a solder bath was restored by charging a small amount of a solder alloy having a high P concentration.

In a soldering tank, soldering of a large number of printed circuit boards is carried out, so the solder alloy in the solder bath adheres to the printed circuit board and decreases in amount. In the past, supply of the amount by which the solder decreased was carried out using a solder alloy not containing P. Namely, the decrease in the P concentration and the decrease in the solder alloy were separately controlled. As a result, a small amount of a solder alloy having a high concentration of P was charged into the solder bath as the P in the solder in the solder bath decreased, and a solder alloy not containing any P was supplied as the solder in the solder bath decreased.

In the above-described case, when the solder alloy forming the solder bath already contained P, it was thought that the same solder alloy could be used as a solder alloy for replenishing. This corresponds to supplying a solder alloy having the same P content as the solder alloy already filling the soldering tank. However, in the case of wave soldering, there is large consumption of P in the solder bath. If a solder alloy having the same concentration of P as that of the solder bath was supplied, an amount of P corresponding to the amount of consumed P could not be replenished.

Accordingly, in this case, too, as the P in the solder in the solder bath decreased, a small amount of a deoxidizing alloy having a high concentration of P was charged so as to restore the P concentration in the solder bath.

In fact, in the past as well, when an oxidation suppressing element in a solder bath was consumed, a method of coping was employed in which an amount corresponding to the consumed oxidation suppressing element was supplied, as stated earlier. For example, a mother alloy adjusted to have a high concentration of an oxidation suppressing element was supplied to a solder bath periodically, such as every day or 2-4 times per month, and the concentration of an oxidation suppressing element in the bath was adjusted.

However, each time this adjusting operation was carried out, it was necessary to perform troublesome operations such as weighing the amount of mother alloy to be charged, charging into the tank and stirring for a fixed length of time, and checking the concentration in the tank after adjustment.

DISCLOSURE OF THE INVENTION

An object of this invention is to provide a soldering method which can suppress oxidation of a solder alloy in a solder bath in cases in which oxidation of a solder alloy in a solder bath becomes a problem, such as in the flow soldering method.

Another object of this invention is to provide a solder alloy for replenishing a solder bath which can stabilize the supply of oxidation suppressing elements such as P for effectively suppressing oxidation of a solder alloy in a solder bath like that described above.

In the flow soldering method, the solder which is consumed includes a portion which adheres to the printed circuit board during soldering and a portion which is discharged to the exterior of the soldering tank as dross, and additional solder alloy in an amount substantially equal to the total amount of these portions is supplied to the solder bath.

Ball-shaped solder, rod-shaped solder or wire-shaped solder is used as a supply means, and it is intermittently supplied to control the liquid surface level of the solder bath. At this time, if the amount of P in the tank can be always maintained constant merely by adding an amount of solder alloy to the solder bath, it becomes unnecessary to perform additional charging of a P-containing deoxidizing alloy just for the purpose of adjusting the amount of P.

The present inventors noticed that the rate of decrease of the amount of an oxidation suppressing element such as P due to the above-described sacrificial oxidation of P is large compared to the rate of decrease of the amount of solder, that if there is a large fluctuation in P, there is a large effect on the mechanical properties of soldered joints, and that when the operating conditions of soldering are constant, the amount of oxidation of oxidation suppressing elements, i.e., the decrease in the amount thereof is nearly constant.

In addition, if as in the past, oxidation suppressing elements are supplied at suitable times in the form of a P-containing deoxidizing alloy, the solder bath composition fluctuates, and as a result the decrease in the amount of oxidation suppressing elements also widely fluctuates.

Therefore, by using as a replenishment solder alloy a solder alloy having the same composition as the initial composition of the solder alloy except for an oxidation suppressing element and if necessary copper, and by determining the time for additional charging based on the decrease in the amount of the solder alloy, fluctuation in the solder bath composition can be minimized.

The present inventors also focused on Sn—Ag based and Sn—Ag—Cu based solder alloys, and as a result of further investigations, they found that normally, when these solder alloys are used in the flow soldering method, around 30 ppm of P is contained in the solder bath as an oxidation suppressing element, and at this time, if it is contained in an amount of around 10-20 ppm in a solder bath, prevention of the formation of dross and defects resulting therefrom are effectively prevented, and for this purpose, a replenishment solder alloy containing 60-100 ppm of P can be used as a replenishment solder alloy.

Thus, the present invention is as follows.

(1) A soldering method carried out using a solder bath to which an oxidation suppressing element is added to carry out soldering while controlling the concentration of the oxidation suppressing element in the bath to be within a prescribed range, characterized by:

using as a replenishment solder alloy a solder alloy including the oxidation suppressing element and having the same alloy composition as the solder bath except for the oxidation suppressing element;

finding the rate of decrease of the oxidation suppressing element in the solder bath during soldering; and charging the replenishment solder alloy containing the oxidation suppressing element in the same or greater proportion than the rate of decrease of the oxidation suppressing element which is consumed at the rate of decrease into the solder bath as soldering progresses.

(2) A soldering method carried out using a solder bath to which an oxidation suppressing element is added to carry out soldering while controlling the concentration of the oxidation suppressing element in the bath to be within a prescribed range, characterized by:

the solder alloy which makes up the solder bath being a lead free solder alloy which includes copper as an alloy component;

using as a replenishment solder alloy a solder alloy including the oxidation suppressing element and having the same alloy composition as the solder bath except for the oxidation suppressing element and copper;

finding the rate of decrease of the oxidation suppressing element in the solder bath during soldering; and charging the replenishment solder alloy containing the oxidation suppressing element in the same or greater proportion than the rate of decrease of the oxidation suppressing element which is consumed at the rate of decrease and containing copper or not containing copper into the solder bath as soldering progresses.

(3) A soldering method as described above in (1), characterized in that the oxidation suppressing element in the replenishment solder alloy has 2 to 6 times the concentration of the target concentration of the oxidation suppressing element in the solder bath.

(4) A soldering method as described above in (2), characterized in that the oxidation suppressing element in the replenishment solder alloy has 2 to 6 times the concentration of the target concentration of the oxidation suppressing element in the solder bath.

(5) A soldering method as described above in any one of (1)-(3) characterized in that the oxidation suppressing element is at least one element selected from the group consisting of P, Ge, Ga, and Ce.

(6) A lead free solder alloy for replenishing a solder bath comprising the above-described solder alloy with respect to a solder bath comprising an alloy including Sn and Ag, characterized by further containing 60-100 ppm by mass of P.

(7) A lead free solder alloy for replenishing a solder bath with respect to a solder bath comprising an alloy including Sn, Ag, and Cu, characterized by further containing 60-100 ppm by mass of P.

(8) A lead free solder alloy for replenishing a solder bath with respect to a solder bath comprising an alloy including, in mass %, Ag: 2.5-3.5%, Cu: 0.2-0.9%, and a remainder of Sn, characterized by further containing 60-100 ppm by mass of P.

In the present invention, the replenishment solder alloy may be supplied to a solder bath as a ball-shaped or rod-shaped or wire-shaped solder alloy.

According to the present invention, by just performing additional charging of a replenishment solder alloy as the solder bath is being consumed, the troublesome operations which were conventionally performed of periodically supplying a deoxidizing alloy having a high concentration of an oxidation suppressing element to the solder bath and adjusting the concentration in the solder bath can be omitted, and merely by performing everyday normal operations, oxidation suppressing elements in the bath can be automatically maintained constant, and maintenance free control of oxidation suppressing elements can be permanently achieved. By this method, complete consumption of oxidation suppressing elements in the soldering tank can be avoided, and a dross suppressing effect can be permanently maintained, so quality of soldered portions in flow soldering can be guaranteed.

According to the present invention, a solder bath comprises a molten solder alloy to which a prescribed concentration, i.e., a target concentration of P is initially added, the rate of decrease of P in the solder bath during soldering operation is determined, a solder alloy is manufactured having a P content which is, for example, 2 to 6 times the target concentration of P so as to maintain a prescribed P concentration by compensating the decrease of P, and the thus-prepared solder alloy can be supplied to the solder bath at the time of replenishing the solder alloy which decreases as soldering operation progresses. This type of solder alloy is referred to as "replenishment solder alloy" in the present specification.

Furthermore, according to the present invention, the P concentration of ball-shaped or rod-shaped or wire-shaped solder which is supplied to the solder bath is set to a proportion which is necessary and sufficient to compensate for the consumption of P. Thus, troublesome operations, which were inevitably performed in the past, such as periodically supplying a deoxidizing alloy having a high content of P to the solder bath and adjusting the P concentration in the solder bath can be omitted, and merely by performing everyday normal operations, the P content in the solder bath can be automatically maintained constant, and maintenance free control of the P content can be permanently achieved.

According to the present invention, therefore, complete consumption of P in the soldering bath can be avoided, and a dross suppressing effect can be permanently maintained, so quality of soldered portions in flow soldering and particularly in wave soldering can always be guaranteed.

BEST MODE FOR CARRYING OUT THE INVENTION

Figure 1:
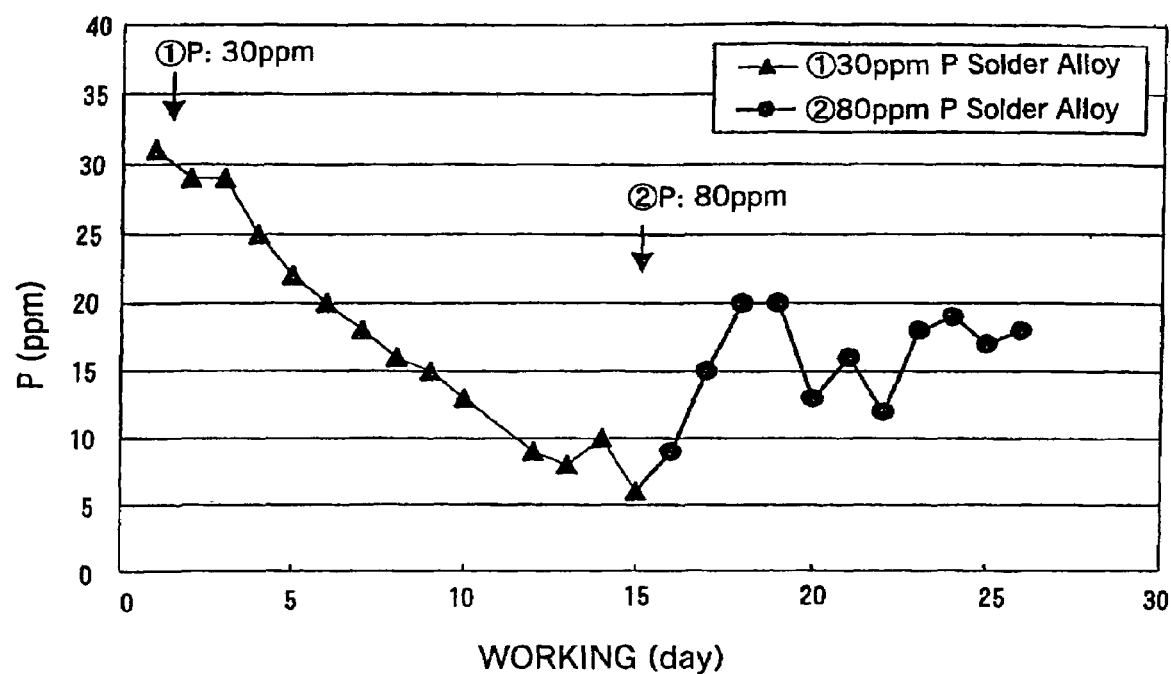
FIG. 1 is a graph showing the change of the P concentration in a solder bath.

An oxidation suppressing element used in a replenishment solder alloy according to the present invention is an element which has an effect of suppressing oxidation of a principal constituent component of a solder alloy by preferentially reacting with oxygen. Some possible examples of this oxidation suppressing element are P, Ga, Ge, Ce, and the like.

In a flow soldering method using a solder bath, according to the present invention, the content of an oxidation suppressing element in the solder bath can be maintained as constant as possible while supplying solder to the solder bath.

Accordingly, the composition of the solder alloy in the solder bath and the composition of the solder alloy additionally supplied to the solder bath, i.e., the replenishment solder alloy, are made basically the same except for the oxidation suppressing element, but in cases when the content of elements increases during soldering, a solder alloy may be supplied which does not include any of the elements which increase, or which includes less than a prescribed content.

For example, when the solder alloy constituting a solder bath in a soldering tank is Sn—Ag—Cu—P, if a large number of printed circuit boards are soldered with this solder alloy, Cu little by little dissolves into the solder bath from the lands of the printed circuit boards, and the Cu content of the solder bath becomes larger than a target content. As a result, needle-shaped Cu—Sn intermetallic compounds precipitate in the solder bath, and they form short circuits between soldered portions and raise the liquidus temperature and worsen solderability.

In this manner, in cases in which the Cu in the solder bath increases at the time of soldering, the replenishment solder alloy may be a solder alloy which contains no Cu at all or which contains less than the target Cu content. In this case as well, the replenishment solder alloy contains the oxidation suppressing element in a high concentration so as to compensate for the decrease thereof and maintain a fixed target concentration.

A solder alloy to which the present invention can be applied can be any solder alloy which can constitute a solder bath and which can be used to carry out flow soldering. For example, in addition to conventionally used Sn—Pb solder alloys, it can be a lead free solder alloy having Sn as a main component (such as Sn—Ag, Sn—Ag—Cu, Sn—Cu, Sn—Bi, and Sn—Zn). To these solder alloys, one or more of Ni, Co, Fe, Cr, Mo, and the like can be added for improving strength, and one or more of Bi, In, Zn, and the like can be added to lower the melting point.

The operating steps in embodiments of the present invention are as follows.

Namely, according to the present invention, a replenishment solder alloy having the same alloy composition except for the oxidation suppressing element is supplied to a solder bath by the following procedure in an amount which is necessary and sufficient to compensate for the consumption of the oxidation suppressing element as well as the solder bath.

(1) A solder alloy previously blended to have a prescribed concentration of an oxidation suppressing element is melted in a soldering tank to form a solder bath.

(2) Soldering operation is carried out using the solder bath for about 1-2 weeks, and the rate of decrease of the oxidation suppressing element in the solder bath is determined.

(3) The amount of decrease in the oxidation suppressing element until the time of charging is determined, and a supply amount corresponding thereto is determined.

(4) The amount of decrease of the solder alloy in the solder bath is determined, the amount of solder alloy so as to compensate therefor is determined, the concentration of the oxidation suppressing element at that time is found from the supplied amount of the oxidation suppressing element, and a solder alloy for replenishment having the same composition as the initial solder alloy except for having the same or greater than the appropriate concentration of the oxidation suppressing element is prepared.

(5) During operation of the solder bath, the replenishment solder alloy which was prepared in (4) is supplied to the solder bath, and the concentration of the oxidation suppressing element in the tank is adjusted to be within a prescribed concentration range (so as to restore the concentration set in (1)).

The following mode is a variation of the present invention.

This mode relates to the case in which the solder alloy contains Cu. A solder alloy having the same alloy composition except for the oxidation suppressing element and Cu is supplied to a solder bath in the following mode in an amount sufficient to offset the consumption of the oxidation suppressing element.

(1) A Cu-containing solder alloy previously blended to have a prescribed concentration of an oxidation suppressing element is melted in a soldering tank to form a solder bath.

(2) Soldering operation is carried out using the solder bath for about 1-2 weeks, and the rate of decrease of the oxidation suppressing element and the rate of decrease of the solder bath are determined.

(3) The amount of decrease of the solder bath and the oxidation suppressing element per prescribed period of time are determined, and a supply amount per prescribed period of time of the solder bath and the oxidation suppressing element are calculated. The concentration of the oxidation suppressing element in the replenishment solder is determined from the respectively calculated replenishment amounts, and a replenishment solder alloy is prepared containing at least this concentration of the oxidation suppressing element and having otherwise the same composition as the initial composition of the solder alloy except for Cu. Of course, when the amount of Cu which is dissolved from lands or the like of printed circuit boards is small, a replenishment solder alloy may be prepared having an amount of Cu corresponding to the decreased amount of Cu in the solder bath.

(4) During operation of the solder bath, the replenishment solder alloy prepared in (3) is intermittently supplied to the solder bath after the above-mentioned prescribed period of time has passed, and the concentration of the oxidation suppressing element in the bath is prevented from falling below a target concentration.

In an example of another variation of the present invention, when supplying a replenishment solder alloy, the supplied amount is determined taking into consideration the decrease until the next replenishment.

In this invention, the times for supplying the replenishment solder alloy to the solder bath can be suitably determined taking the amount of decrease in the solder bath, the volume of the soldering tank, and the like into consideration.

As a simple method, in the present invention, a replenishment solder alloy may be prepared containing a concentration of approximately 2 to 6 times a target concentration of the oxidation suppressing element, and this may be supplied in a suitable amount. In this manner, the period of charging of the replenishment solder alloy can be varied and adjusted in accordance with the rate of decrease of the oxidation suppressing element.

As is clear from the above description, according to the present invention, an oxidation suppressing element in a solder bath can always be controlled. Such an effect was explained primarily using wave soldering as an example, but also with a flow soldering method using a stationary solder bath in a high temperature environment exceeding 300° C., such as in a soldering method for urethane coated copper wire, the molten solder reaches a high temperature, so the consumption of oxidation suppressing elements becomes marked. The effects of the invention are marked when it is applied to such a soldering method as well.

From yet another standpoint, the present invention is a lead free, replenishment solder alloy which contains Sn and Ag and further contains 60-100 ppm by mass of P, the alloy being used to maintain the P content of a solder bath constant while supplying the replenishment solder alloy to the solder bath in a flow soldering method.

In the present invention, the constituent elements of the solder alloy of a solder bath and the constituent elements of a solder alloy supplied to the solder bath are fundamentally the same except for the oxidation suppressing element, but as stated earlier, in cases in which the content of elements increases during soldering, a solder may be supplied which does not contain any of the elements which increase or which has a smaller content than a prescribed content.

In a solder alloy for replenishing a solder bath according to the present invention, if the P content is less than 60 ppm, the amount of P which is consumed during wave soldering cannot be replenished and the P content in the bath decreases, and the amount of P in the bath cannot be maintained in a stable state. If it is larger than 100 ppm, there is a tendency for the wettability of the solder alloy to decrease. If such a solder alloy is mistakenly initially charged into a bath, soldering defects accompanying a decrease in wettabilty occur, the overall defect rate increases, and running costs may increase. Therefore, the upper limit on the amount of P in the present invention is 100 ppm.

Namely, in one aspect, the present invention is a solder alloy for replenishing a solder bath, and the upper limit on the P content thereof is defined so that there is no problem if it is mistakenly initially charged into a bath.

A lead free solder according to the present invention is an Sn—Ag based solder or an Sn—Ag—Cu based solder further containing P. Suitable contents of Ag and Cu in Sn are weight ratios of 2.5-3.5% for Ag and 0.2-0.9% for Cu. If the content of Ag and Cu are greater than or smaller than these ranges, the liquidus temperature of the solder is increased and the molten temperature range is increased, so soldering defects may occur more easily and soldering operations may become more difficult, so it is not suitable for flow soldering.

EXAMPLES

Example 1

Specific steps in carrying out this example are as follows.

(1) Sn-3.0Ag-0.5Cu-0.003P solder, which is a P-containing lead free solder alloy suitable for suppressing oxidation of molten solder, was melted to form a solder bath (weight: 330 kg).

(2) The decrease in the amount of the solder bath in the soldering tank during 12 days of operation, i.e., the replenished amount of the solder alloy and the rate of decrease of the P concentration were determined.

Total supplied amount of Sn-3.0Ag-0.5Cu-0.003P solder alloy to the solder bath: 220 kg Concentration of P in the solder bath after 12 days of operation: 0%

(3) The average decrease per day in the amount of the oxidation suppressing element for 12 days was determined, a supplied amount corresponding thereto was calculated, the concentration of P in the replenishment solder alloy was set, and such a solder alloy was manufactured.

Solder supply amount: 20 kg/day

P decrease: 2 g/day

P concentration in replenishment solder: 100 ppm

Replenishment solder alloy: Sn-3.0Ag-0.5Cu-0.01P (4) Soldering of printed circuit boards was carried out for 12 days using the solder bath, and an Sn-3.0Ag-0.5Cu-0.01P solder alloy was supplied to the solder bath when the solder alloy of the solder bath decreased. The concentration of P in the solder alloy of the solder bath was measured on the 12th day and was found to be 0.003%.

Example 2

This example illustrates the case in which a solder alloy not containing Cu is supplied as a replenishment solder alloy.

(1) An Sn-3.0Ag-0.5Cu-0.003P solder, which is a P-containing lead free solder alloy suitable for suppressing oxidation of solder, was melted to fill a soldering tank to form a solder bath (weight: 330 kg).

(2) The decrease in the amount of the solder bath in the soldering tank during 9 days of operation, i.e., the supplied amount of the solder alloy and the rate of decrease of the P concentration were determined. In this example, the composition of the replenishment solder alloy, except for P, was Sn-3.0Ag.

Total supplied amount of Sn-3.0Ag-0.003P solder alloy to the solder bath: 90 kg

Concentration of P of the solder bath after 9 days of operation: 0%

(3) The average decreases per day in the amount of the solder bath and of the oxidation suppressing element for 9 days were determined, supplied amounts corresponding thereto were calculated, the concentration of P in the replenishment solder alloy was set, and such a solder alloy was manufactured.

Solder supply amount: 10 kg/day
P decrease: 1.4 g/day
P concentration in replenishment solder: 170 ppm
Replenishment solder alloy: Sn-3.0Ag-0.017P (4) Soldering of printed circuit boards was carried out for 9 days using the solder bath, and an Sn-3.0Ag-0.017P solder alloy was supplied to the solder bath when the solder alloy of the solder bath decreased. The concentration of P in the solder alloy of the solder bath was measured on the 9th day and was found to be 0.003%.

Example 3

This example illustrates the case in which a Pb-containing solder alloy is used as a replenishment solder alloy.

(1) A Pb-63Sn-0.003P solder, which is a P-containing solder alloy suitable for suppressing oxidation of solder, was melted to form a solder bath (weight: 330 kg).

(2) The decrease in the amount of the solder bath in the solder bath during 14 days of operation, i.e., the supplied amount of the solder alloy and the rate of decrease of the P concentration were determined. In this example, the composition of the replenishment solder alloy, except for P, was Pb-63Sn.

Total supplied amount of Pb-63Sn solder alloy to the solder bath: 200 kg

Concentration of P in the solder bath after 14 days of operation: 0.001%

(3) The average decreases per day in the amount of the solder bath and the amount of the oxidation suppressing element for 14 days were determined, supplied amounts corresponding thereto were calculated, the concentration of P in the replenishment solder alloy was set, and such a solder alloy was manufactured.

Solder supplied amount: 20 kg/day
P decrease: 0.9 g/day
P concentration in replenishment solder: 75 ppm
Replenishment solder alloy: Pb-63Sn-0.0075P (4) Soldering of printed circuit boards was carried out for 14 days using the solder bath, and a Pb-63Sn-0.0075P solder alloy was supplied to the solder bath when the solder alloy of the solder bath decreased. The concentration of P in the solder alloy of the solder bath was measured on the 14th day and was found to be 0.003%.

Example 4

A soldering tank which contained a solder bath used in this example was an indirectly heated wave soldering bath with a weight of 460 kg. A solder alloy was melted in advance in the above-described soldering tank (initial charging) to fill it and prepare a solder bath. At this time, the solder alloy used for initial charging was a lead free solder having a composition of Sn-3.0Ag-0.5Cu-0.003P (mass %).

As a comparative example, a replenishment solder which was the same as the solder alloy used for initial charging of the solder bath was used for 15 days. The change of the P concentration in the solder bath at this time was as shown by graph (1) in FIG. 1. The P content in the solder bath after 15 days of operation was an extremely low level of 5 ppm by mass.

Next, as an example of the present invention, a solder alloy having the same principal components (Sn, Ag, Cu) and having a P content adjusted to 80 ppm by mass was used to replenish a solder bath. The change of the P concentration in the solder bath at this time is shown by graph (2) in FIG. 1. By continuing to charge the replenishment solder alloy having a P content of 80 ppm by mass, the P content in the solder bath was stably maintained at a level of 20 ppm by mass.

INDUSTRIAL APPLICABILITY

The present invention can be applied not only to the flow soldering method but also to a stationary soldering method, and the same excellent effects can be exhibited.

In addition, according to the present invention, by performing everyday normal operations, the P content in a tank can be automatically maintained constant, and maintenance free control of P content can be permanently achieved.

The invention claimed is:

1. A soldering method comprising: preparing a solder bath having an initial composition prior to initial soldering using the solder bath and containing a first nonzero concentration of an oxidation suppressing element; performing a first soldering operation for a period of a plurality of days using the solder bath while replenishing the solder bath with a first replenishment solder alloy having the same composition as the initial composition of the solder bath to maintain the surface level of molten solder in the solder bath, the concentration of the oxidation suppressing element in the solder bath reaching a second concentration at the end of the period;

determining the average rate of decrease of the oxidation suppressing element in the solder bath during the first soldering operation over the period; and performing a second soldering operation using the solder bath after the first soldering operation and starting when the concentration of the oxidation suppressing element in the solder bath is at the second concentration while replenishing the solder bath to maintain the surface level of molten solder in the solder bath with a second replenishment solder alloy having a third concentration of the oxidation suppressing element which is higher than the first concentration, the third concentration having a value such that the rate of supply of the oxidation suppressing element in the second replenishment solderalloy to the solder bath in the second soldering operation is greater than or equal to the determined average rate of decrease of the oxidation suppressing element in the solder bath during the first soldering operation.

2. A method as claimed in claim 1 wherein the third concentration is 2 to 6 times the first concentration.

3. A method as claimed in claim 1 wherein the third concentration is 60 to 100 ppm.

4. A method as claimed in claim 1 including performing the first soldering operation for approximately 1-2 weeks.

5. A method as claimed in claim 1 wherein the second replenishment solder alloy has the same composition as the initial composition of the solder bath except for the oxidation suppressing element.

6. A method as claimed in claim 1 wherein the second replenishment solder alloy has the same composition as the initial composition of the solder bath except for the oxidation suppressing element and copper.

7. A soldering method as claimed in claim 1 wherein the oxidation suppressing element is selected from P, Ge, Ga, and Ce.

* * * * *

UNITED STATES PATENT AND TRADEMARK OFFICE
CERTIFICATE OF CORRECTION

PATENT NO. : 7,628,308 B2  Page 1 of 1
APPLICATION NO. : 10/500802
DATED : December 8, 2009
INVENTOR(S) : Ojima et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 926 days.

Signed and Sealed this

Second Day of November, 2010

David J. Kappos
*Director of the United States Patent and Trademark Office*